(12) United States Patent
Shirley

(10) Patent No.: US 6,288,964 B1
(45) Date of Patent: Sep. 11, 2001

(54) METHOD TO ELECTRICALLY PROGRAM ANTIFUSES

(75) Inventor: Brian Shirley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/359,369

(22) Filed: Jul. 23, 1999

(51) Int. Cl.[7] ........................................ G11C 8/00
(52) U.S. Cl. ............................... 365/225.7; 365/230.06
(58) Field of Search ............................. 365/200, 225.7, 365/230.06

(56) References Cited

U.S. PATENT DOCUMENTS

| | | | |
|---|---|---|---|
| 5,471,154 | 11/1995 | Gordon et al. | 326/38 |
| 5,631,862 | 5/1997 | Cutter et al. | 365/96 |
| 5,672,994 | 9/1997 | Au et al. | 327/525 |
| 5,715,209 | 2/1998 | Yoo | 365/230.03 |
| 5,812,468 | 9/1998 | Shirley | 365/200 |
| 5,883,849 | 3/1999 | Shirley | 365/230.02 |
| 5,936,908 | * 8/1999 | Loughmiller et al. | 365/225.7 |
| 6,077,211 | 6/2000 | Vo | 365/225.7 |

FOREIGN PATENT DOCUMENTS 62-122328   6/1987   (JP).

* cited by examiner

Primary Examiner—David Nelms
Assistant Examiner—M. Tran
(74) Attorney, Agent, or Firm—Dickstein Shapiro Morin & Oshinsky LLP

(57) ABSTRACT

The present invention provides a system and method for decoding antifuses without requiring a local address decode at the antifuse bank. In accordance with a preferred embodiment of the present invention, a separate antifuse is provided for each global column decode line. Therefore, setting only one column decoder high (e.g., for each read or write cycle, or for an address entered by an operator through the pad during pre-conditioning) not only activates the corresponding column of the memory cell array, but also provides the enable signal to decode the corresponding antifuse sitting on that same global select line. Thereafter, a "pop voltage" (i.e., the voltage required to blow the antifuse) is routed to that particular antifuse from a source that is external to the antifuse bank.

34 Claims, 3 Drawing Sheets

METHOD TO ELECTRICALLY PROGRAM ANTIFUSES

BACKGROUND OF THE INVENTION

1. Field of the Invention

The present invention relates to the field of integrated circuits. More specifically, it relates to a method for programming antifuses in dynamic random access memory (DRAM) using a signal from a global column decoder and a programming line with which the antifuse is paired.

2. Description of the Related Art

Typical DRAM circuits include arrays of memory cells arranged in rows and columns. Each of the rows and columns are driven by a respective row decoder and column decoder. Typically, these memory circuits include several redundant rows and columns that are used as substitutes for defective locations in the memory array. For example, rather than having 1024 columns (i.e., $2^{10}$ columns), a typical array might have 1028 columns, along with 1028 column decoders.

As is depicted in FIG. 1, normal practice is for the column decoders $CD_1$, $CD_2$, $CD_3$, $CD_4$ . . . $CD_N$ to receive memory cell addresses (e.g., during a normal read or write operation) coming from external sites (e.g., external pads). Before the addresses reach the column decoders, they may be passed through one or all of a series of buffers, and/or redundancy decoders. The addresses then reach the column decoders where they are cascaded through the column decoders until the address data reaches the one particular column decoder that matches the incoming address. Each of the column decoders is also coupled to a corresponding Y-gate driver, or inverter $I_1$, $I_2$, $I_3$, $I_4$ . . . $I^N$. During a normal read or write operation, only one of the column decoders (i.e., only one of 1028) is set high at a time. That is, when the address is fully decoded as corresponding to a particular column decoder, that column decoder is set logic high (e.g., 1) while all others remain logic low (e.g., 0).

Typically, the logic high signal of the column decoder is sent across the entire memory array 10 (e.g., which may consist of as many as 16 sub-array blocks tiled side by side) where it is coupled to sense amplifiers (not shown) between every block.

When a defective memory array location has been identified, a repair is effected. Rather than treating the entire array as defective, one of the redundant rows or columns are substituted for a defective row or column. This substitution is performed by assigning the address of the defective row or column to the redundant row or column and decoding the address with a redundant column decoder such that, when an address signal corresponding to a defective row or column is received by one of said column decoders $CD_1$, $CD_2$, $CD_3$, $CD_4$ . . . $CD_N$, and the redundant column decoder the redundant row or column is addressed instead. This makes the substitution of the redundant row or column substantially transparent to a system employing the memory circuit.

An example of fuse blowing is found in the programming of sense lines. Fusebank address detection circuits employ a bank of sense lines where each sense line corresponds to a bit of an address. The sense lines are programmed by blowing fuses in the sense lines in patterns corresponding to the address of the defective row or column.

Traditionally, the fuses have been blown by having a laser cut the fuse conductors to remove the conductive paths through the fuses. One problem with such an approach is that the laser cutting of the fuses is time consuming, difficult and imprecise. Therefore, the cost and reliability of memory devices employing laser fuse bank circuits can be less than satisfactory.

More recently, memory devices have been employing antifuse banks in place of conventional fuses. Antifuses are capacitive-type structures that, in their unblown states, form open circuits. Antifuses may be blown by applying a high voltage across the antifuse. The high voltage causes the capacitive-type structure to break down, forming a conductive path through the antifuse. Therefore, blown antifuses conduct and unblown antifuses do not conduct.

While redundant repair is one goal associated with the blowing of antifuses, as is known in the art, antifuses may be blown e.g., to change the state of another signal associated with a bad column, or to lessen defect currents, etc.

Typically, the current practice is to locate antifuse banks at a periphery of a memory array block where separate antifuse electrical decode circuitry is required in order to determine which particular antifuse is to be programmed. The separate antifuse decoder circuitry comprises a second set of address decoding circuitry (i.e., in addition to the already existing column decoders) for determining which antifuse is to be programmed and eventually blown.

The separate antifuse decoder circuitry, located adjacent to the antifuse bank and also at a periphery of the memory array, receives address data from the address lines that are coupled to the global column decoders. That is, the separate antifuse address decoder circuitry receives the same address information as received by the global column decoder which has been selected (e.g., during normal read or write operations) only to redundantly perform the address decode operation again so as to determine which antifuse is to be programmed.

For example, assuming a typical memory array capacity of 64 Mb; such an array comprises 512 global column decode lines, which correspond to 9 address bits that require decoding (i.e., $2^9=512$). Therefore, when the antifuse decoding is performed within the antifuse bank itself, by a local address decoder, a total of 18 address bit lines (i.e., 9 ADDRESS lines and 9 $\overline{\text{ADDRESS}}$ lines) must be routed from an address decoding section of the DRAM to a periphery of the DRAM (where such antifuse banks are ideally located) where the addresses are locally decoded within the antifuse bank. After the address lines are locally decoded, the blowing of a particular antifuse (as determined by the address decoder) is enabled. This extraneous routing of the address lines severely complicates integrated circuit (IC) design, thereby resulting in larger die-size and increased manufacturing costs.

Therefore, rather than taking advantage of existing IC designs and the logic high signal (e.g., 1) that is already being produced by the column decoders, the programming of antifuses associated with, e.g., column repair, column preconditioning, etc., are typically performed as described above. Thus there exists a need for a system and method for programming antifuses, thereby selecting the antifuses to be blown, without requiring additional circuitry in the form of a local address decoder at the antifuse bank, and without requiring the extraneous routing of address lines to a periphery of a DRAM.

SUMMARY OF THE INVENTION

The present invention overcomes the problems associated with the prior art and provides a system and method for programming antifuses without requiring additional address decoder circuitry at the antifuse bank and without requiring the routing of address lines to a periphery of a DRAM.

In accordance with a preferred embodiment of the present invention, a separate antifuse is provided for each global column decoder. Therefore, setting only one column decoder to logic high (e.g., for each read or write cycle, or for an address entered by an operator through the pad during pre-conditioning) not only activates the corresponding column of the memory cell array, but also provides the enable signal to program a corresponding antifuse sitting on that same global select program line. That is, when a column decoder is set logic high, the particular antifuse sitting on that same line receives the same logic high signal, thereby indicating that that particular antifuse has been selected to be blown. Accordingly, a "pop voltage" (i.e., the voltage required to blow the antifuse) is routed to that particular antifuse from a source that is external to the antifuse bank.

The present invention provides a method and system for programming antifuses, e.g., as used in connection with DRAMs, without requiring additional address decoder circuitry at the antifuse bank. The invention utilizes already existing DRAM address decoder circuitry to effectively program a particular antifuse.

BRIEF DESCRIPTION OF THE DRAWINGS

These and other advantages and features of the invention will be more clearly understood from the following detailed description of the invention that is provided in connection with the accompanying drawings in which.

DETAILED DESCRIPTION OF A PREFERRED EMBODIMENT

A preferred embodiment of the present invention will now he described with reference to FIGS. 2–3. Other embodiments may be realized and structural, or logical changes may be made to the disclosed embodiment without departing from the spirit or scope of the present invention.

Figure 1:
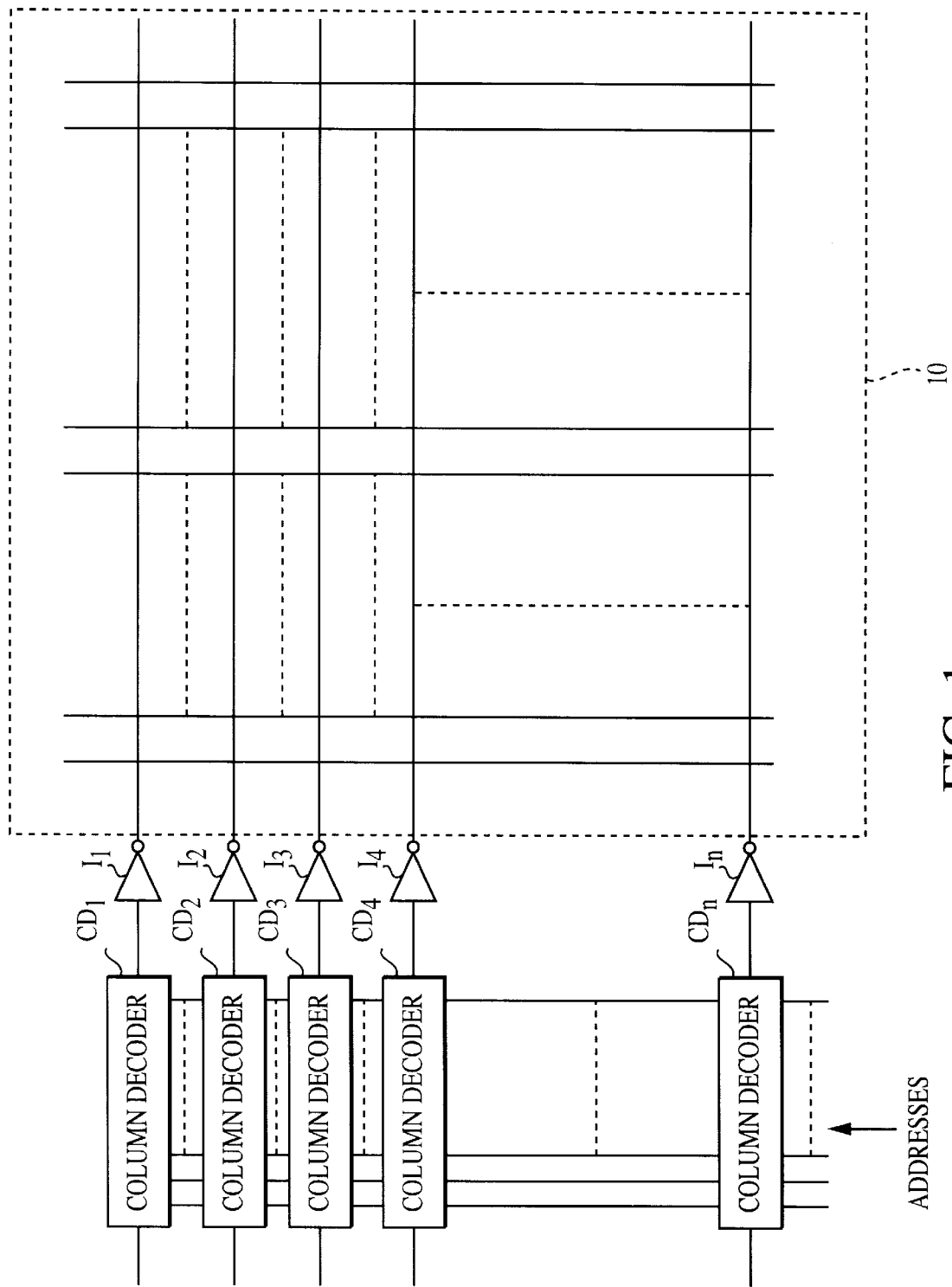
FIG. 1 illustrates a series of column decoders located adjacent to a typical DRAM memory cell array.
Figure 2:
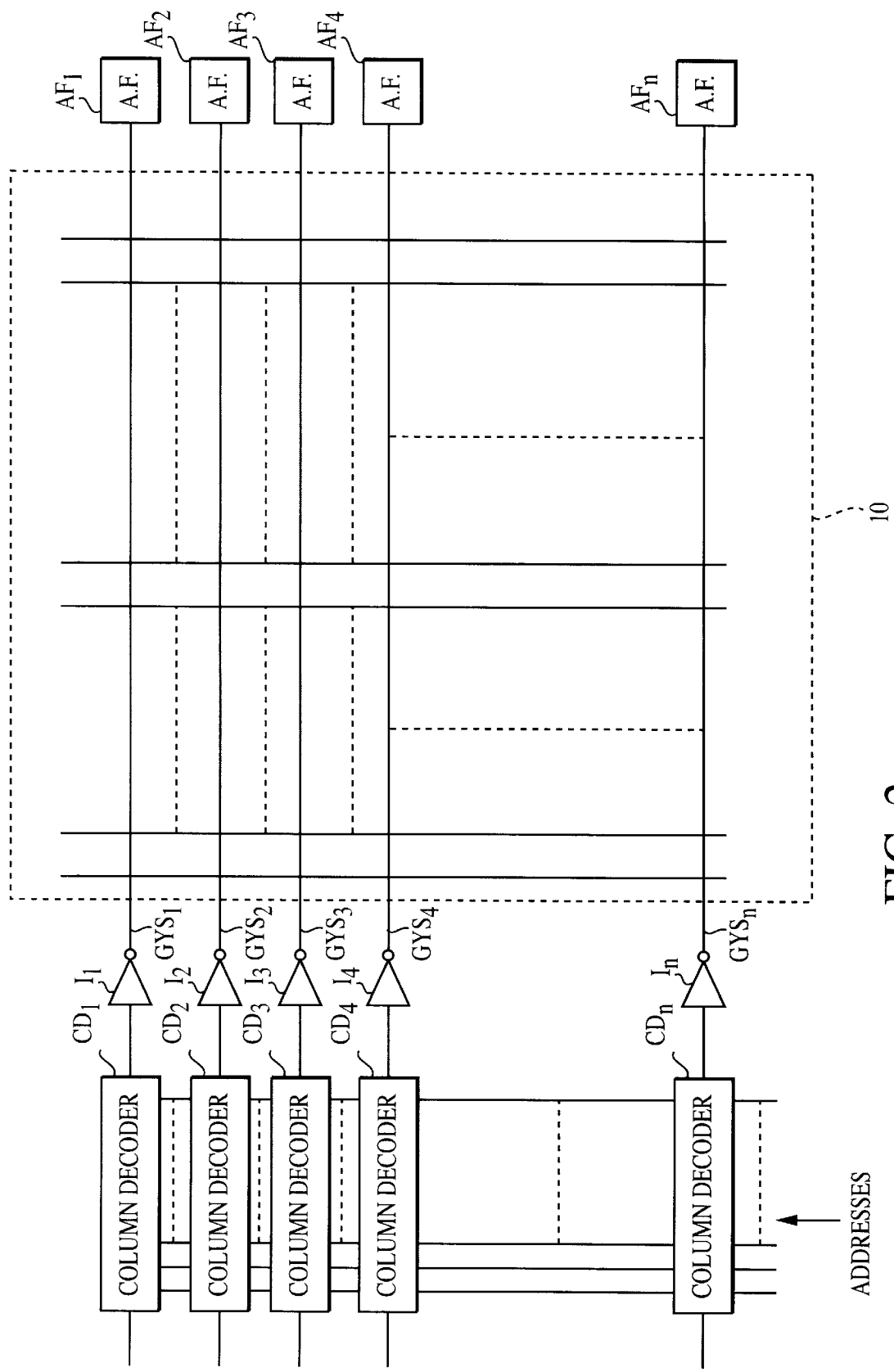
FIG. 2 illustrates the FIG. 1 configuration with each column decoder being coupled to a respective antifuse cell, in accordance with a preferred embodiment of the invention.

FIG. 2 depicts a series of column decoders $CD_1$, $CD_2$, $CD_3$, $CD_4$ . . . $CD_N$ located adjacent to a DRAM memory cell array 10 with each of the column decoders being coupled to a respective column. Located between each column decoder and its corresponding column is an inverter $I_1$, $I_2$, $I_3$, $I_4$ . . . $I_N$. In addition, each column decoder is coupled to a respective antifuse cell $AF_1$, $AF_2$, $AF_3$, $AF_4$ . . . $AF_N$. In accordance with a preferred embodiment of the invention, the signal that is present on a global y-select line $GYS_1$, $GYS_2$, $GYS_3$, $GYS_4$ . . . $GYS_N$ (e.g., high or low) is forwarded to a respective antifuse cell to which it is coupled. That is, the global y-select lines $GYS_1$, $GYS_2$, $GYS_3$, $GYS_4$ . . . $GYS_N$ act to designate which antifuse is to be decoded (i.e., blown) rather than having a separate antifuse decoder circuit at the antifuse bank for decoding a particular antifuse. Once a particular antifuse has been selected to be blown, a pop voltage is routed to that particular antifuse in order to effectuate the blowing of the antifuse.

Figure 3:
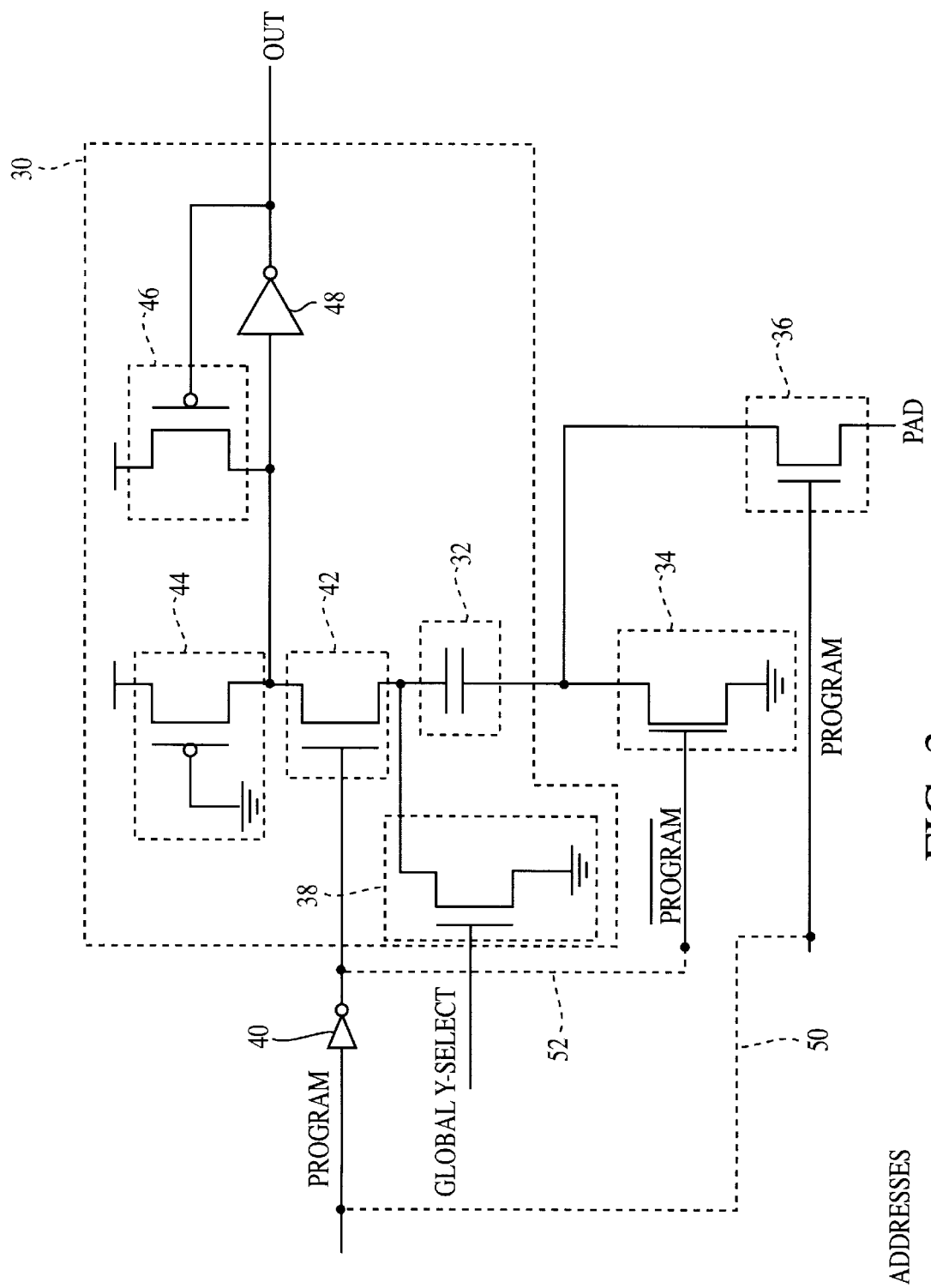
FIG. 3 illustrates a detailed description of an antifuse cell, in accordance with a preferred embodiment of the invention.

Turning now to FIG. 3, a detailed description of an antifuse cell 30 is depicted, in accordance with a preferred embodiment of the invention. Each antifuse cell 30 contains an antifuse 32, a first side of which is coupled to a source of a metal-oxide-semiconductor field-effect transistor (MOSFET) 38, and is also coupled to a source of MOSFET 42. A drain of MOSFET 38 is coupled to ground and a gate of MOSFET 38 is coupled to a respective global y-select line $GYS_1$, $GYS_2$, $GYS_3$, $GYS_4$ . . . $GYS_N$ of a column decoder $CD_1$, $CD_2$, $CD_3$, $CD_4$ . . . $CD_N$ that corresponds to this particular antifuse cell 30.

A gate of MOSFET 42 is coupled to an inverter 40 which inverts the signal that is present on the PROGRAM line. A drain of MOSFET 42 is coupled to a source of MOSFET 44. A gate of MOSFET 44 is coupled to ground and a drain of MOSFET 44 is floating. A drain of MOSFET 42 is also coupled to a source of MOSFET 46 and an input of inverter 48. A drain of MOSFET 46 is floating. An output of inverter 48 is coupled to a gate of MOSFET 46. An output of the inverter 48 is also the output signal of the antifuse cell 30.

Coupled to the antifuse cell 30 is MOSFET 34 and MOSFET 36. A source of MOSFET 34 is coupled to a second side of the antifuse 32. A drain of MOSFET 34 is coupled to ground. A gate of MOSFET 34 is coupled to an inverted program line (i.e., $\overline{\text{PROGRAM}}$) A gate of MOSFET 36 is coupled to the PROGRAM line and a source of MOSFET 36 is coupled to the pad where e.g., an external pop voltage source is located. Furthermore, the PROGRAM lines may be coupled together via connector 50 and similarly, the $\overline{\text{PROGRAM}}$ lines may be coupled together via connector 52.

The PROGRAM line comes from a PROGRAM circuit that outputs a PROGRAM signal (e.g., a high signal) when the DRAM is in antifuse programming mode. That is, when the DRAM is in an antifuse programming mode (e.g., when designating a redundant column, or during preconditioning), a corresponding PROGRAM signal is sent to the gate of MOSFET 36. Additionally, $\overline{\text{PROGRAM}}$ is sent to the gates of MOSFETs 42 and 34.

Under normal operation, in accordance with a preferred embodiment of the invention, the pop voltage sits on the pad terminal of the source of MOSFET 36. When the DRAM is in the program mode, and a PROGRAM signal is set e.g., high, the pop voltage also sits on the second side of antifuse 32. When the global y-select line $GYS_1$, $GYS_2$, $GYS_3$, $GYS_4$ . . . $GYS_N$ (of FIG. 2) that corresponds to this particular antifuse cell 30 is also set e.g., high, the second side of antifuse 32 is effectively coupled to ground, via MOSFET 38, and the difference of potential between the plates of the antifuse 32 is sufficient for that antifuse 30 to blow. The output OUT of the antifuse cell 30 may then be utilized for its usual applications as are well known in the art.

Moreover, since MOSFETs 34 and 36, and the pad voltage are not part of the antifuse cell 30, the MOSFET pair of 34 and 36 and the pad voltage may be joined and utilized as described above for more than one antifuse cell 30. That is, while each antifuse cell 30 has one antifuse 32, one inverted program signal and one respective global y-select line $GYS_1$, $GYS_2$, $GYS_3$, $GYS_4$ . . . $GYS_N$ at its input, several antifuse cells 30 (or all 1028 antifuse cells) may share the MOSFET pair of 34 and 36 and the voltage pad.

The present invention provides both a system and method for programming antifuses without requiring a local address decode operation at the antifuse bank and without requiring address lines be routed to a periphery of a DRAM. Therefore, as a result of the invention, DRAM designs are greatly simplified since there is no need for a local address decoder and corresponding address lines runing from the primary address decoders, at the column decoders, to a secondary address decoder at the antifuse bank.

While a preferred embodiment of the invention has been described and illustrated, it should be apparent that many modifications can be made to the invention without departing from its spirit or scope. For example, although the invention is depicted as being used for decoding antifuses, the invention may be used in order to decode any other programmable elements or components. In addition, while a particular circuit diagram employing specific electronic components is depicted for practicing the invention, it should be readily apparent that many other combinations of the same or similar components may be substituted for those described above, while still providing a method and system for programming antifuses by using existing circuitry, and without deviating from the spirit or scope of the invention. Accordingly, the invention is not limited by the foregoing description or drawings, but is only limited by the scope of the appended claims.

What is claimed as new and desired to be protected by Letters Patent of the United States is:

1. A system for programming a programmable device in a memory device, the system comprising:

at least one memory address decoder adapted to receive memory cell address data, wherein said at least one memory address decoder transmits an output signal for addressing at least a selected memory cell of said memory device when a specified address is recognized; and at least one programmable device coupled to said at least one memory address decoder for receiving said output signal such that the receipt of said output signal results in said programmable device being receptive to being programmed by a programming signal.

2. The system as in claim 1, wherein said address decoder is a column address decoder, said system further comprising at least one column of memory cells, said at least one column of memory cells being coupled to an output of said at least one column address decoder for receiving said output signal.

3. The system as in claim 2 further comprising at least one inverter, an input of said at least one inverter being coupled to an output of said at least one address decoder, and wherein an output of said at least one inverter is coupled to said at least one column of memory cells.

4. The system as in claim 1, wherein said at least one programmable device is used in connection with a random access memory.

5. The system as in claim 4, wherein said random access memory comprises a dynamic random access memory.

6. The system as in claim 1 further comprising at least one programming circuit for programming said at least one programmable device, said programming circuit being switchably coupled to said at least one programmable device.

7. The system as in claim 6, wherein said at least one programmable device has a first side and a second side, wherein when said first side experiences a change in voltage potential with respect to said second side in response to said programmable device being selected, said change in potential causes said programmable device to be programmed.

8. The system as in claim 7, wherein said second side experiences a change in voltage potential with respect to said first side in response to said programming circuit's receipt of a PROGRAM signal from a PROGRAM signal source.

9. The system as in claim 6, wherein said at least one programmable device is programmed upon receipt of said output signal and a PROGRAM signal from a PROGRAM signal source.

10. The system as in claim 9, wherein said at least one programming circuit comprises an antifuse cell, said antifuse cell comprising:

an antifuse;

at least a first electrically conductive component switchably coupled to a first side of said antifuse, said first electrically conductive component being adapted to receive said output signal; and at least a second electrically conductive component switchably coupled to a first side of said antifuse, said second electrically conductive component being adapted to receive said PROGRAM signal.

11. The system as in claim 10, wherein said first and second electrically conductive components comprise transistors.

12. The system as in claim 11, wherein said transistors comprise metal-oxide-semiconductor field-effect transistors.

13. The system as in claim 10, wherein an output terminal of said antifuse cell is switchably coupled to said first side of said antifuse.

14. The system as in claim 13 further comprising an inverter, an input of said inverter being switchably coupled to said first side of said antifuse, an output of said inverter being coupled to said antifuse cell output terminal.

15. The system as in claim 10 further comprising:

at least a third electrically conductive component switchably coupled to said second side of said antifuse, said third electrically conductive component being adapted to receive a $\overline{\text{PROGRAM}}$ signal from said PROGRAM signal source; and at least a fourth electrically conductive component switchably coupled to said second side of said antifuse, said fourth electrically conductive component being adapted to receive said PROGRAM signal from said PROGRAM signal source.

16. The system as in claim 15, wherein said fourth electrically conductive component is adapted to switchably couple a voltage sufficient to electrically couple said first side to said second side of said antifuse.

17. The system as in claim 15, wherein said third and fourth electrically conductive components comprise transistors.

18. The system as in claim 17, wherein said transistors comprises metal-oxide-semiconductor field-effect transistors.

19. The system as in claim 6, wherein said programming circuit comprises:

an antifuse having a first side and a second side;

a first MOSFET, a source of which is coupled to said first side of said antifuse, a gate of said first MOSFET being adapted to receive said output signal;

a second MOSFET, a gate of which is adapted to receive a $\overline{\text{PROGRAM}}$ signal from a PROGRAM signal source, a source of said second MOSFET being coupled to said first side of said antifuse;

a third MOSFET, a source of which is coupled to said second side of said antifuse, a drain of said third MOSFET being coupled to ground, and a gate of said third MOSFET being adapted to receive said $\overline{\text{PROGRAM}}$ signal; and a fourth MOSFET, a drain of which is coupled to said second side of said anifuse, a gate of said fourth MOSFET being adapted to receive a PROGRAM signal, and a source of said fourth MOSFET being coupled to a voltage source.

20. The system as in claim 1, wherein said at least one programmable device comprises at least one antifuse.

21. A method for programming a programmable device in a memory device, the method comprising:
- receiving memory cell address data at at least one memory address decoder;
- transmitting an output signal from said at least one memory address decoder for addressing at least a selected memory cell of said memory device when an address is recognized by said at least one memory address decoder; and
- receiving said output signal at at least one programmable device such that the receipt of said output signal results in said programmable device being receptive to being programmed by a programming signal.

22. The method as in claim 21 further comprising transmitting said output signal to at least one column of memory cells, said at least one column of memory cells being coupled to an output of said at least one address decoder.

23. The method as in claim 22 further comprising inverting said output signal before said output signal is received by said at least one column of memory cells.

24. The method as in claim 21, wherein said act of receiving address data is performed in connection with the operation of a random access memory.

25. The method as in claim 24, wherein said random access memory comprises a dynamic random access memory.

26. The method as in claim 21, wherein said at least one programmable device comprises at least one antifuse.

27. The method as in claim 21, wherein said at least one address decoder comprises at least one column decoder.

28. The method as in claim 21, wherein said act of programming further comprises:
- receiving said output signal at at least a first electrically conductive component; and
- changing, in response to said output signal, a voltage potential of a first side of said programmable device with respect to a second side of said programmable device, said first side of said programmable device being coupled to said at least a first electrically conductive component.

29. The method as in claim 28 further comprising:
- receiving a PROGRAM signal from a PROGRAM signal source at at least a second electrically conductive component; and
- receiving at said second side of said programmable device a voltage sufficient to electrically couple said first and second side of said programmable device from an external source.

30. The method as in claim 28, wherein said at least a first electrically conductive component comprises at least a first transistor.

31. The method as in claim 30, wherein said at least a first transistor comprises at least a first metal-oxide-semiconductor field-effect transistor.

32. The method as in claim 29, wherein said at least a second electrically conductive component comprises at least a second transistor.

33. The method as in claim 32, wherein said at least a second transistor comprises at least a second metal-oxide-semiconductor field-effect transistor.

34. The method of claim 21 further comprising receiving said output signal at at least one programming circuit for programming said at least one programmable device, said programnming circuit being switchably coupled to said at least one programmable device.

* * * * *